United States Patent
Burl et al.

(10) Patent No.: US 6,927,575 B2
(45) Date of Patent: Aug. 9, 2005

(54) SURFACE COIL DECOUPLING MEANS FOR MRI SYSTEMS

(75) Inventors: Michael Burl, Chagrin Falls, OH (US); Mark Xueming Zou, Mantua, OH (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 10/761,553

(22) Filed: Jan. 21, 2004

(65) Prior Publication Data

US 2004/0189300 A1 Sep. 30, 2004

Related U.S. Application Data

(60) Provisional application No. 60/441,441, filed on Jan. 21, 2003.

(51) Int. Cl.[7] .................................................. G01V 3/00
(52) U.S. Cl. ...................................... 324/318; 324/309
(58) Field of Search ................................ 324/318, 319, 324/309, 307, 300, 322; 600/422; 128/653

(56) References Cited

U.S. PATENT DOCUMENTS

| | | | | |
|---|---|---|---|---|
| 3,961,331 A | * | 6/1976 | Campbell | 343/792 |
| 4,620,155 A | * | 10/1986 | Edelstein | 324/322 |
| 4,682,125 A | * | 7/1987 | Harrison et al. | 333/12 |
| 4,825,162 A | * | 4/1989 | Roemer et al. | 324/318 |
| 4,839,594 A | * | 6/1989 | Misic et al. | 324/318 |
| 4,922,204 A | | 5/1990 | Duerr et al. | |
| 4,922,205 A | * | 5/1990 | Shimizu et al. | 324/454 |
| 5,075,624 A | * | 12/1991 | Bezjak | 324/318 |
| 5,489,847 A | * | 2/1996 | Nabeshima et al. | 324/318 |
| 5,664,568 A | * | 9/1997 | Srinivasan et al. | 128/653.5 |
| 5,804,969 A | * | 9/1998 | Lian et al. | 324/318 |
| 6,445,181 B1 | * | 9/2002 | Pelc et al. | 324/307 |
| 6,549,799 B2 | * | 4/2003 | Bock et al. | 600/422 |
| 6,552,544 B2 | * | 4/2003 | Wong et al. | 324/318 |
| 6,727,703 B2 | * | 4/2004 | Lee | 324/322 |
| 2002/0169374 A1 | * | 11/2002 | Jevtic | 600/422 |

OTHER PUBLICATIONS

Jianmin Wang, A Novel Method to Reduce the Signal Coupling of Surrface Coils for MRI, ISMRM Anual meeting 1996, p. 1434.

Sodickson, Daniel, Simltaneous Acquisition of Spatial Harmonics (SMASH): Fast Imaging with Radiofrequency Coil Arrays, 1997, MRM 38:591–603.

* cited by examiner

Primary Examiner—Brij B. Shrivastav
(74) Attorney, Agent, or Firm—Carl B. Horton, Esq.; Armstrong Teasdale LLP

(57) ABSTRACT

A system and method for decoupling coils in a medical imaging system are provided. The coil system includes a first coil of a medical imaging system, a second coil of the medical imaging system, and a balun device connected to the first and second coils. The balun device is configured to decouple the first and second coils of the medical imaging system.

22 Claims, 4 Drawing Sheets

SURFACE COIL DECOUPLING MEANS FOR MRI SYSTEMS

CROSS REFERENCE TO RELATED APPLICATIONS

This application claims priority to and the benefit of the filing date of U.S. Provisional Application No. 60/441,441, filed on Jan. 21, 2003 and which is hereby incorporated by reference in its entirety.

BACKGROUND OF THE INVENTION

This invention relates generally to magnetic resonance imaging (MRI) systems and, more particularly, to radio-frequency (RF) coils in such systems.

Magnetic Resonance Imaging (MRI) utilizes hydrogen nuclear spins of the water molecules in the human body, which are polarized by a strong, uniform, static magnetic field of a magnet (typically denoted as $B_0$—the main magnetic field in MRI physics). The magnetically polarized nuclear spins generate magnetic moments in the human body. The magnetic moments point or are aligned parallel to the direction of the main magnetic field $B_0$ in a steady state and produce no useful information if they are not disturbed by any excitation.

The generation of nuclear magnetic resonance (NMR) signals for MRI data acquisition is accomplished by exciting the magnetic moments with a uniform radio-frequency (RF) magnetic field (typically referred to as the $B_1$ field or the excitation field), for example, by applying a uniform RF magnetic field orthogonal to $B_0$. This RF field is centered on the Larmor frequency of protons in the $B_0$ field and causes the magnet moments to mutate their alignment away from $B_0$ by some predetermined angle. The $B_1$ field is produced in the imaging region of interest typically by an RF transmit coil that is driven by a computer-controlled RF transmitter with a RF power amplifier. During excitation, the nuclear spin system absorbs magnetic energy, and the magnetic moments precess around the direction of the main magnetic field. After excitation, the precessing magnetic moments will go through a process of free induction decay (FID), releasing their absorbed energy and returning to a steady state. During FID, NMR signals are detected by the use of a receive RF coil that is placed in the vicinity of the excited volume of a human body. The NMR signal is the secondary electrical voltage (or current) in the receive RF coil that has been induced by the precessing magnetic moments of the human tissue. The receive RF coil can be either the transmit coil itself or an independent receive-only RF coil. The NMR signal is used for producing MR images by using additional pulsed magnetic gradient fields that are generated by gradient coils integrated inside the main magnet system. The gradient fields are used to spatially encode the signals and selectively excite a specific volume of the human body. There are usually three sets of gradient coils in a standard MRI system that generate magnetic fields in the same direction of the main magnetic field and varying linearly in the imaging volume.

In MRI, it is desirable for the excitation and reception to be spatially uniform in the imaging volume for better image uniformity. In a standard MRI system, the best excitation field homogeneity is usually obtained by using a whole-body volume RF coil for transmission. The whole-body transmit coil is the largest RF coil in the system. A large coil, however, produces lower signal-to-noise ratio (SNR or S/N) if it is also used for reception, mainly because of its greater distance from the signal-generating tissues being imaged. Because a high signal-to-noise ratio is the most desirable in MRI, special-purpose coils are used for reception to enhance the S/N ratio from the volume of interest.

In practice, a well-designed specialty RF coil has the following functional properties: high S/N ratio, good uniformity, high unloaded quality factor (Q) of the resonance circuit, and high ratio of the unloaded to loaded Q factors. In addition, the coil device must be mechanically designed to facilitate patient handling and comfort, and to provide a protective barrier between the patient and the RF electronics. A further way to increase the SNR is to replace the single specialty coil with an array of smaller coils and through the use of multiple receivers add the signals together at the image construction stage. For this method to work effectively, the signals received from each coil in the array must collect or obtain signals from near the tissue and resonate with signals coupled from other coils. The coils must be decoupled to prevent signals from one coil interfering with signals from another coil.

One known method for decoupling coils includes overlapping adjacent coils by an amount necessary to cancel mutual inductance. However, this method is limited in that it requires the coils to be adjacent to each other, thus, limiting the ability to move the coils. Another known method for decoupling the coils includes canceling the mutual inductance by adding an extended loop to each coil, thus creating a transformer whose mutual inductance is designed to cancel the coupling between the two pickup coils. However, this method introduces capacitance between the coils and significant loss of Q factor. Still another known method for decoupling the coils includes using a capacitor common to two surface coils to cancel the mutual inductance between the surface coils. This series cancellation has a parallel equivalent where the series capacitor becomes a network. However, again, the coils must be adjacent to each other.

Thus, these known methods for decoupling coils restrict the design of coil arrangements (e.g., requiring coils to be adjacent to each other) in the MRI system. Therefore, the operation and control of these MRI systems is limited. For example, when designing a coil arrangement, only an overlap area that is acceptable for zero coupling may be used rather than a geometry that is optimum for imaging.

BRIEF DESCRIPTION OF THE INVENTION

In one exemplary embodiment, a coil system for a medical imaging system is provided. The coil system includes a first coil of a medical imaging system, a second coil of the medical imaging system, and a balun device connected to the first and second coils. The balun device is configured to decouple the first and second coils of the medical imaging system.

In another exemplary embodiment, a system for decoupling coils in a medical imaging system is provided. The system includes balun means connected between coils of a medical imaging system for decoupling the coils and connection means for connecting the balun means to the coils.

In yet another exemplary embodiment, a method for decoupling coils in a medical imaging system is provided. The method includes configuring a balun for connection between coils in a medical imaging system to decouple the coils.

DETAILED DESCRIPTION OF THE INVENTION

Various exemplary embodiments of the present invention provide a system and method for decoupling coils in, for example, a magnetic resonance imaging (MRI) system. For example, the various exemplary embodiments provide means for decoupling coils (e.g., a plurality of tuned surface coils) that may be adjacent each other or separated by a gap.

Figure 1:
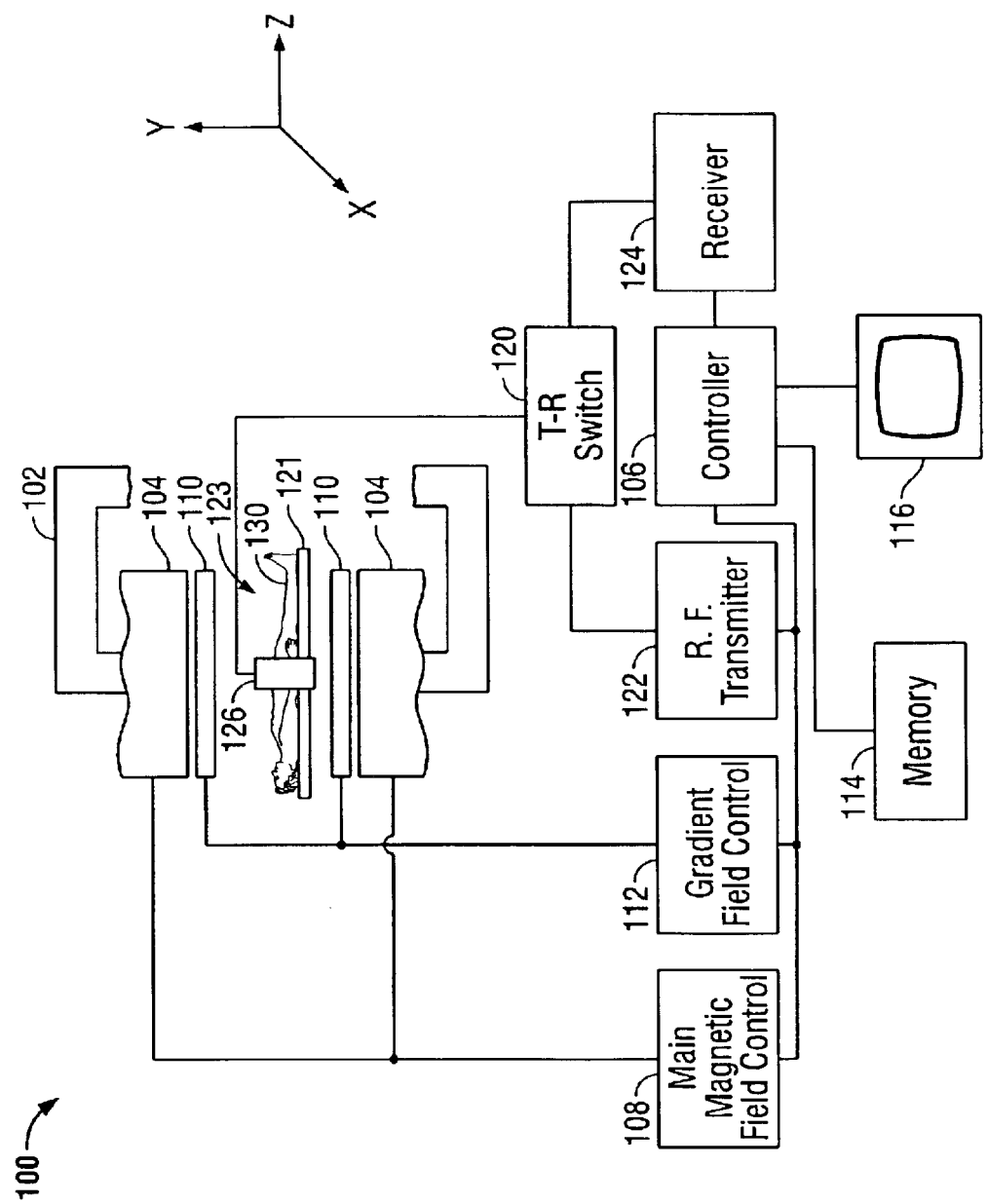
FIG. 1 is a block diagram of an exemplary embodiment of a magnetic resonance imaging (MRI) system in which systems and methods for decoupling are implemented.

FIG. 1 is a block diagram of an exemplary embodiment of an MRI system in which systems and methods for decoupling in accordance with various embodiments of the present invention may be implemented. As shown therein, an MRI system 100 includes an electromagnet 102, pole pieces 104, a controller 106, a main magnetic field control 108, a gradient coil sub-system 110, a gradient field control 112, a memory 114, a display device 116, a transmit-receive (T-R) switch 120, a radio frequency (RF) transmitter 122, a receiver 124 and an array of detectors 126 (e.g., a cylindrical array of equally-spaced detectors). It should be noted that although electromagnet 102 is a C-shaped magnet, other shapes of electromagnets can be used.

In use of the MRI system 100, a body 130 of an object, such as a patient or a phantom to be imaged, is placed in a opening or gap 123 between pole pieces 104 on a suitable support 121 (e.g., patient table). The electromagnet 102 produces a uniform and static main magnetic field $B_0$ across the gap 123. The strength of the electromagnetic field in the gap 123 and correspondingly in the body 130, is controlled by the controller 106 via a main magnetic field control 108, which also controls a supply of energizing current to the electromagnet 102.

The gradient coil sub-system 110, having one or more gradient coils, is provided so that a magnetic gradient can be imposed on the magnetic field $B_0$ in the gap 123 between pole pieces 44 in any one or more of three orthogonal directions x, y, and z. Gradient coil sub-system 110 is energized by gradient field control 112 and is also controlled by the controller 106.

The array 126, which may include a plurality of coils (e.g., resonant surface coils), is arranged to simultaneously detect MR signals from the body 130. The array 126 is selectably interconnected to one of the RF transmitter 122 or receiver 124 by the T-R switch 120. The RF transmitter 122 and T-R switch 120 are controlled by the controller 106 such that RF field pulses or signals are generated by the RF transmitter 122 and selectively applied to the body 130 for excitation of magnetic resonance in the body 130. While the RF excitation pulses are being applied to the body 130, the T-R switch 120 also is actuated to decouple the receiver 124 from the array 126.

Following application of the RF pulses, the T-R switch 120 is again actuated to decouple the array 126 from the RF transmitter 122 and to couple the array 126 to the receiver 124. The array 126 includes detectors that operate to detect or sense the MR signals resulting from the excited nuclei in the body 130 and communicates the MR signals to the receiver 124. These detected MR signals are in turn communicated to the controller 106. The controller 106 includes a processor (e.g., image reconstruction processor) that controls the processing of the MR signals to produce signals representative of an image of the body 130. The processed signals representative of the image are transmitted to the display device 116 to provide a visual display of the image. Specifically, the MR signals fill or form a k-space which is Fourier transformed to obtain a viewable image. The processed signals representative of the image are then transmitted to the display device 116.

In operation, the magnetic field $B_0$ generated by the electromagnet 102 is applied to the body 130 that lies along a z-axis of a Cartesian coordinate system, the origin of which is within the body 130. The uniform magnetic field $B_0$ being applied has the effect of aligning nuclear spins, a quantum mechanical property of nuclei within the body 130, along the y-axis. In response to the RF pulses of a proper resonant frequency being generated by the RF transmitter 122, and that are orientated within an x-z plane perpendicular to the y-axis, the nuclei resonate at their Larmor frequencies. In a typical imaging sequence, an RF pulse centered about the Larmor frequency is applied to the body 130 at the same time a magnetic field gradient $G_z$ is being applied along the z-axis by means of the gradient coil sub-system 110. The gradient $G_z$ causes nuclei in a slice with a limited width through the body 130 along the x-y plane, to have a resonant frequency and to be excited into resonance.

After excitation of the nuclei in the slice, magnetic field gradients $G_x$ and $G_y$ are applied along the x and y axes respectively. The magnetic field gradient $G_x$ along the x-axis causes the nuclei to precess at different frequencies depending on their position along the x-axis. Essentially, $G_x$ spatially encodes the precessing nuclei by frequency, referred to as frequency encoding. A y-axis gradient $G_y$ is incremented through a series of values and encodes a y-axis rate of change of phase of the precessing nuclei as a function of the amplitude of the gradient $G_y$, a process referred to as phase encoding.

Figure 2:
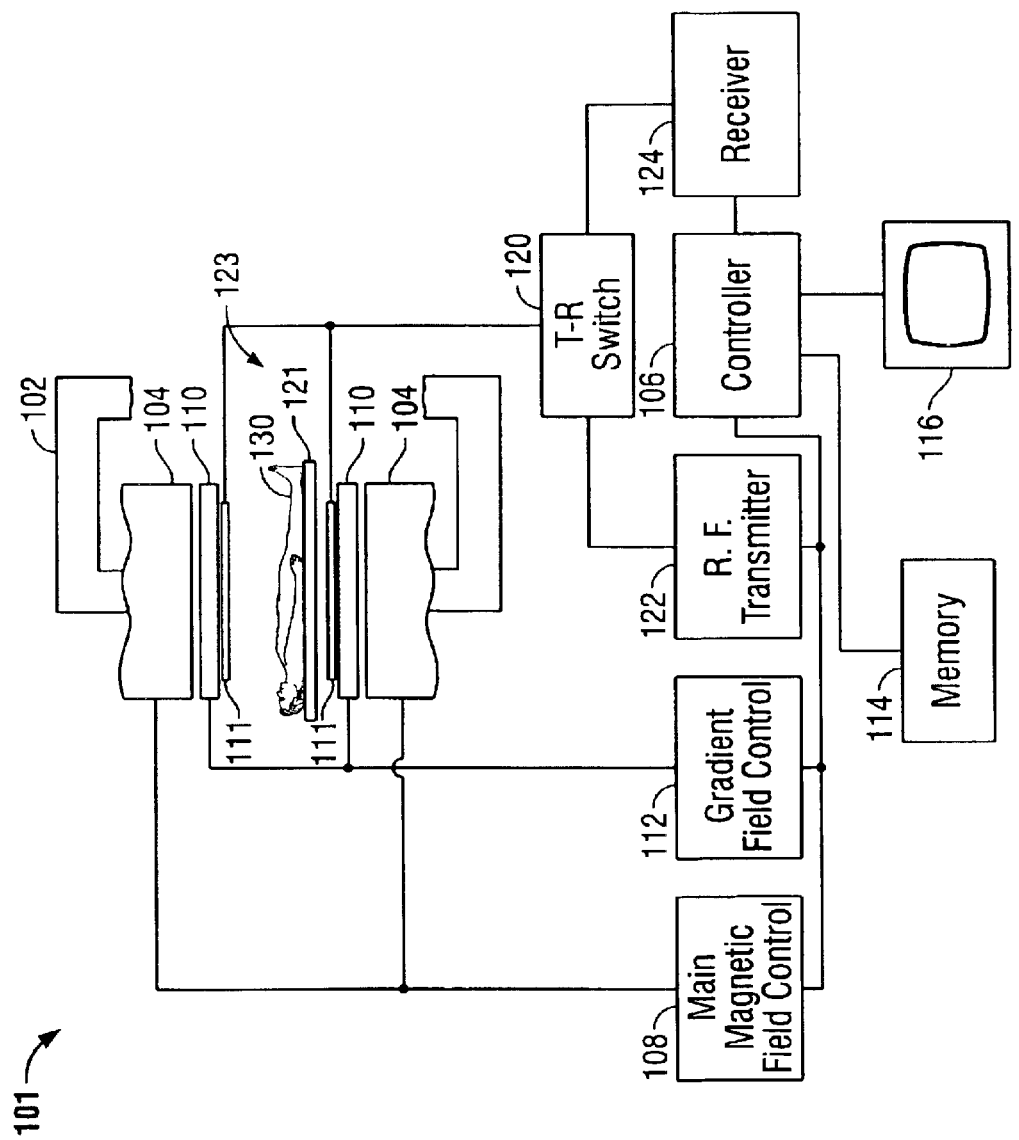
FIG. 2 is a block diagram of another exemplary embodiment of a magnetic resonance imaging (MRI) system in which systems and methods for decoupling are implemented.

It should be noted that the various embodiments of the present invention are not limited to use in connection with the MRI system 100 described herein, but may be implemented in connection with other MRI systems and/or other medical imaging systems. For example, in an MRI system 101 as shown in FIG. 2, array 126 may be replaced with coil arrays 111.

Referring again to the array 126 and to the coil arrays 111, these arrays typically include a plurality of tuned surface coils (not shown). The tuned surface coils are decoupled from each other so that, for example, different channels of the receiver 124 corresponding to separate surface coils only receive signals from the surface coil to which it is connected.

Various exemplary embodiments of the present invention provide a means, including a system and method, for surface coil decoupling that reduces limitations on the design of the surface coils. The various exemplary embodiments provide decoupling of coils from one another such that a current path is not introduced between the coils. For example, various embodiments of the present invention may be used in connection with phased array coils and/or coil arrays designed for parallel image acquisition to decouple the coils. The coils to be decoupled do not have to be adjacent each other (e.g., a gap between coils to be decoupled).

In general, various embodiments of the present invention may be used for decoupling coils of an MRI system and include a device that converts between or joins two devices (e.g. coils) that have balanced and unbalanced electrical signals, and referred to herein generally as a balun. The balun may be configured, for example, as any type of suitable transmission line (e.g., coaxial cable, strip-line or micro-strip device, such as a trace on a printed circuit board), transmission medium (e.g., isolation transformer) and/or transmission network (e.g., phase shift network), whether distributed components (e.g., transmission line) or lumped components (e.g., lattice balun), combinations thereof, and/or any other suitable device or medium providing balanced/unbalanced connection and or conversion.

Figure 3:
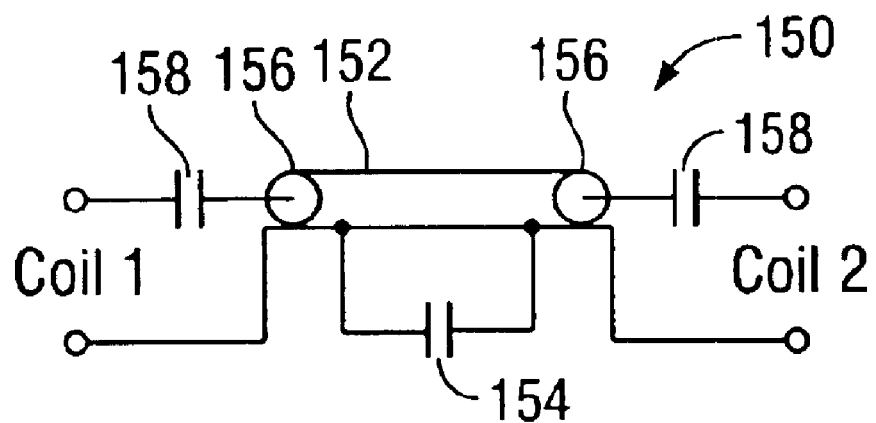
FIG. 3 is a schematic diagram of a balun device of an exemplary embodiment of the present invention for decoupling coils in an MRI system.

One exemplary embodiment of a system including a balun device for use in connection with an MRI system 100 or 101 (shown in FIGS. 1 and 2) is shown in FIG. 3. As shown therein, the balun device 150 is formed of a coaxial cable 152 and a balun capacitor 154. For example, the balun device 150 may include a short (e.g., less than ¼ wavelength) coaxial cable 152 that is resonated with the balun capacitor 154. The coaxial cable 152 has connected at each of its ends 156 a capacitor 158 shown in series connection with the coaxial cable 152. The capacitors 158 are length compensation capacitors that are configured to cancel at least some of the phase shift in the coaxial cable 152. Thus, the value of the capacitors 158 may be selected based upon the length of the coaxial cable 152 and the desired operating characteristics.

Figure 4:
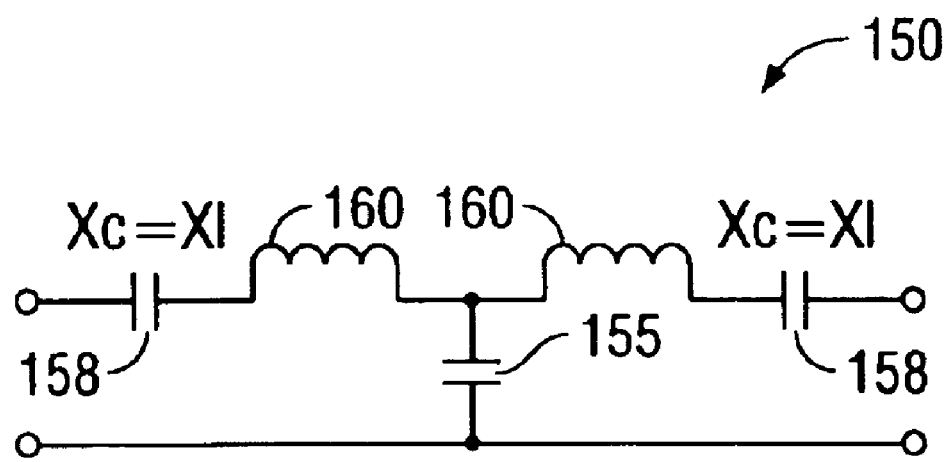
FIG. 4 is another schematic diagram of a balun device of an exemplary embodiment of the present invention for decoupling coils in an MRI system.

As should be appreciated, FIG. 4 shows the T-equivalent circuit of the balun device 150 of FIG. 3. The coaxial cable 152 is represented in the equivalent circuit as a pair of inductors 160, which each represent one-half the series inductance ($X_1$) of the coaxial cable 152. The parallel capacitance of the coaxial cable 152 is represented by the capacitor 155. In an exemplary embodiment, the value ($X_c$) of the capacitors 158 is equal to the series inductance $X_1$ of the coaxial cable 152 (i.e., $X_c=X_1$). Thus, the value of each capacitor 158 is selected to have a reactance equal to one-half the inductive reactance of the coaxial cable 152. This exemplary embodiment thereby provides a zero phase shift between the ends 156 of the coaxial cable 152 and a shunt capacitance, provided by the capacitor 155, is determined based on, for example, the type and length of the coaxial cable 152. It should be noted that in order to block current flow between coils (not shown), at least part of the coaxial cable 152 may be coiled and resonated using a capacitor 154 (shown in FIGS. 3 and 5) to form the balun device 150. Also, the value of the balun capacitor is selected, for example, to tune the shield 156 (shown in FIG. 5) of the coaxial cable 152 to an impedance to prevent current flow therethrough.

Figure 5:
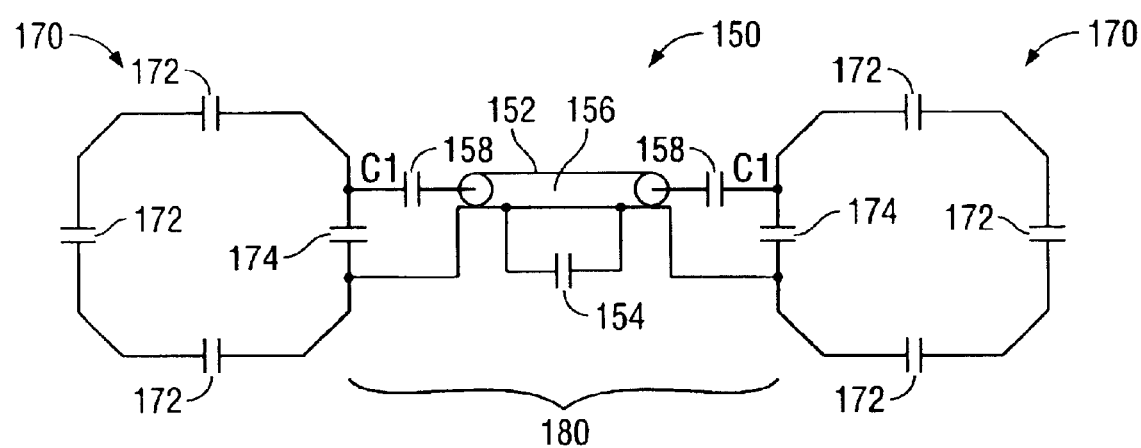
FIG. 5 is another schematic diagram of a balun device of an exemplary embodiment of the present invention for decoupling coils in an MRI system connected to the coils.

As shown in FIG. 5, the balun device 150 as described herein is connected between two coils 170 (e.g., resonant surface coils) of an MRI system 100 or 101 (shown in FIGS. 1 and 2) and are tuned in any known manner using one or more tuning capacitors 172. A decoupling capacitor 174 is also provided and connected in parallel with the coaxial cable 152. The value of the decoupling capacitor 174 is selected to cancel the mutual inductance between the coils 170. It should be noted that when configuring the connection of the coils 170, the connection must compensate for the parallel effect of the capacitance of the coaxial cable 152 (e.g., subtract the parallel effect of the capacitance).

It should be noted that the types and values of the component parts of the various embodiments may be selected as desired as needed. For example, the values of the component parts may be selected based upon the field strength of the MRI system. Merely for exemplary purposes, a typical loop coil tuned to sixty-four megahertz (MHz) may have a plurality of tuning capacitors (e.g., tuning capacitors 172) each having a value of about forty-seven pico-Farads (pF), with each of a matching capacitor (not shown) and decoupling capacitor 174 having about twice the value, or about ninety-four pF.

The configuration and arrangement of the balun device 150 of the various embodiments of the present invention allow for decoupling of coils, for example, in an MRI system, wherein the coils may be separated by a gap 180. As should be appreciated, modifications to the configuration and arrangement of the balun device 150 are possible. For example, the value of the decoupling capacitors 174 may be reduced with the value of one of the tuning capacitors 172 adjusted and the value of the capacitor 158 decreased to compensate for the smaller value of the decoupling capacitor 174. This modification creates a capacitive attenuator between the two coils 170 using extra series capacitive reactance of capacitor 158 and the shunt capacitance represented by the capacitor 154 of the coaxial cable 152. As another example, phase shift may be added to the coaxial cable 152 to adjust the electrical length of the coaxial cable 152 to one-half lambda ($\lambda/2$) with the connection to one of the decoupling capacitors 174 reversed. As still another example, the two decoupling capacitors 174 may be replaced by inductors with appropriate modifications to the connections.

Thus, the balun device 150 as described herein allows for decoupling of coils, for example, in an MRI system and provides flexibility in the design of MRI systems (e.g., coils may be separated by a gap).

While the invention has been described in terms of various specific embodiments, those skilled in the art will recognize that the invention can be practiced with modification within the spirit and scope of the claims.

What is claimed is:

1. A coil system for a medical imaging system, the coil system comprising:
    a first coil of a medical imaging system;
    a second coil of the medical imaging system; and
    a balun device connected to the first and second coils, the balun device configured to decouple and prevent a current flow between the first and second coils of the medical imaging system.

2. A coil system in accordance with claim 1 wherein the balun device comprises one of a coaxial cable, strip-line device, micro-strip device, phase shift network and balun network.

3. A coil system in accordance with claim 1 wherein the medical imaging system comprises a magnetic resonance imaging (MRI) system and the first and second coils comprise resonant surface coils.

4. A coil system in accordance with claim 1 further comprising a balun capacitor in connection with the balun device.

5. A coil system in accordance with claim 1 further comprising a compensation capacitor in series connection with each of an end of the balun device.

6. A coil system in accordance with claim 1 further comprising a decoupling capacitor in connection with each of the first and second coils.

7. A coil system in accordance with claim 1 further comprising a compensation capacitor in series connection with each of an end of the balun device, and wherein the value of each compensation capacitor is configured to have a reactance equal to one-half an inductive reactance of the balun device.

8. A coil system in accordance with claim 1 further comprising a balun capacitor in connection with the balun device, the value of the balun capacitor determined based upon the type and length of the balun device.

9. A coil system in accordance with claim 1 further comprising a decoupling capacitor and a plurality of tuning capacitors in connection with each of the first and second coils.

10. A coil system in accordance with claim 1 wherein the first and second coils are separated by a gap.

11. A system for decoupling coils in a medical imaging system, the system comprising:

balun means connected between coils of a medical imaging system for decoupling and prevent a current flow between the coils; and connection means for connecting the balun means to the coils.

12. A system in accordance with claim 11 wherein the connection means further comprises compensation means for compensating for phase shift in the balun means.

13. A system in accordance with claim 11 further comprising decoupling means connected to each of the coils for canceling mutual inductance between the coils.

14. A system in accordance with claim 11 further comprising tuning means connected to each of the coils for tuning each of the coils.

15. A system in accordance with claim 11 wherein the balun means comprises inductive components.

16. A system in accordance with claim 11 wherein the balun means comprises inductive and capacitive components.

17. A system in accordance with claim 11 wherein the connection means comprises capacitive components.

18. A system in accordance with claim 11 wherein the medical imaging system comprises a magnetic resonance imaging (MRI) system and the coils comprise resonant surface coils.

19. A system in accordance with claim 11 wherein the coils are separated by a gap.

20. A method for decoupling coils in a medical imaging system, the method comprising:

configuring a balun for connection between coils in a medical imaging system to decouple and prevent a current flow between the coils.

21. A method in accordance with claim 20 further comprising configuring the coils for connection to the balun to decouple the coils.

22. A method in accordance with claim 20 wherein the coils are separated by a gap.

* * * * *